(12) United States Patent
Yen et al.

(10) Patent No.: US 10,504,853 B2
(45) Date of Patent: Dec. 10, 2019

(54) ELECTRONIC DEVICE CAPABLE OF SUPPRESSING ELECTROMAGNETIC RADIATION AND MANUFACTURING METHOD THEREOF

(71) Applicant: Realtek Semiconductor Corporation, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/925,792

(22) Filed: Mar. 20, 2018

(65) Prior Publication Data
US 2018/0323154 A1 Nov. 8, 2018

(30) Foreign Application Priority Data

May 2, 2017 (TW) .............................. 106114509 A

(51) Int. Cl.
| | | |
|---|---|---|
| *H01L 23/552* | (2006.01) | |
| *H01L 23/48* | (2006.01) | |
| *H01L 23/00* | (2006.01) | |
| *H01L 49/02* | (2006.01) | |

(52) U.S. Cl.
CPC .......... *H01L 23/552* (2013.01); *H01L 23/481* (2013.01); *H01L 24/14* (2013.01); *H01L 24/16* (2013.01); *H01L 24/17* (2013.01); *H01L 28/10* (2013.01); *H01L 2224/1411* (2013.01);
(Continued)

(58) Field of Classification Search
CPC ..... H01L 23/552; H01L 23/481; H01L 24/14; H01L 24/16; H01L 24/17; H01L 28/10; H01L 2224/1411; H01L 2224/16145; H01L 2224/16227; H01L 2224/17107; H01F 27/2804; H01F 27/362; H01F 17/0006
See application file for complete search history.

(56) References Cited

U.S. PATENT DOCUMENTS

| | | |
|---|---|---|
| 9,775,269 B2 | 9/2017 | Yen et al. |
| 9,905,357 B2 | 2/2018 | Yen et al. |
| 2013/0049826 A1 | 2/2013 | Kim et al. |

(Continued)

FOREIGN PATENT DOCUMENTS

| | | |
|---|---|---|
| TW | I575695 B | 3/2017 |
| TW | 201715706 A | 5/2017 |

OTHER PUBLICATIONS

Hsiao-Tsung Yen et al., Semiconductor Package Structure, Application No. 15877400, Filed on Jan. 23, 2018.
(Continued)

*Primary Examiner* — Shahed Ahmed
(74) *Attorney, Agent, or Firm* — CKC & Partners Co., LLC

(57) ABSTRACT

An electronic device includes a first semiconductor die, a plurality of bumps, and a substrate. The first semiconductor die includes a first conductive feature. The bumps are disposed on the first semiconductor die and are connected to the first conductive feature. The substrate includes a second conductive feature. The bumps are electrically connected to the second conductive feature. The first conductive feature, the bumps, and the second conductive feature are configured to form at least one ring structure.

13 Claims, 7 Drawing Sheets

(52) U.S. Cl.
CPC ............ *H01L 2224/16145* (2013.01); *H01L 2224/16227* (2013.01); *H01L 2224/17107* (2013.01)

(56) References Cited

U.S. PATENT DOCUMENTS

| | | | | |
|---|---|---|---|---|
| 2015/0143311 | A1* | 5/2015 | Chang | G06F 17/5081 716/111 |
| 2015/0381135 | A1* | 12/2015 | Tsai | H01F 27/2804 333/175 |
| 2016/0113159 | A1* | 4/2016 | Yen | H05K 9/0071 361/818 |
| 2017/0236791 | A1* | 8/2017 | Yen | H01L 24/49 257/664 |
| 2018/0102470 | A1* | 4/2018 | Das | H01L 23/49888 |

OTHER PUBLICATIONS

Yen, Hsiao-Tsung et al., Semiconductor Package Structure, Application No. 106107634, Filed on Mar. 8, 2017.

* cited by examiner

ELECTRONIC DEVICE CAPABLE OF SUPPRESSING ELECTROMAGNETIC RADIATION AND MANUFACTURING METHOD THEREOF

CROSS-REFERENCE TO RELATED APPLICATION

This application claims priority to Taiwan Application Serial Number 106114509, filed May 2, 2017, which is herein incorporated by reference.

BACKGROUND

Field of Invention

The present disclosure relates to an electronic device which can suppress a coupling of electromagnetic radiation in an environment. More particularly, the present disclosure relates to a method for manufacturing the electronic device.

Description of Related Art

The coupling phenomenon is often relevant to inductors and wires of integrated circuits. For example, the coupling phenomena may occur between two inductors, between two wires or between an inductor and a wire. The coupling phenomenon is particularly problematic in high-frequency ranges, e.g., frequencies between 5 GHz-10 GHz or frequencies higher than 10 GHz, which severely affects the performance of the integrated circuits.

With respect to the coupling phenomenon occurring between two inductors, since the trend of development in integrated circuit manufacturing processes is miniaturization of the integrated circuits, the distances respectively between pairs of inductors in an integrated circuit are becoming smaller. Therefore, the coupling phenomenon occurring between pairs of inductors is getting more apparent. Furthermore, in practical applications, the inductor can be, such as, a transformer, a transmission line, or a metal trace.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is directed to an electronic device. An electronic device includes a first semiconductor die, a plurality of bumps, and a substrate. The first semiconductor die includes a first conductive feature. The bumps are disposed on the first semiconductor die and are connected to the first conductive feature. The substrate includes a second conductive feature. The bumps are electrically connected to the second conductive feature. The first conductive feature, the bumps, and the second conductive feature are configured to form at least one ring structure.

Another aspect of the present disclosure is directed to a method for manufacturing an electronic device. The method includes forming a first conductive feature and a plurality of bumps on the first semiconductor die, in which the first conductive feature is electrically connected to the bumps; and electrically connecting the bumps to a second conductive feature of a substrate, such that the first conductive feature, the bumps, and the second conductive feature form at least one ring structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
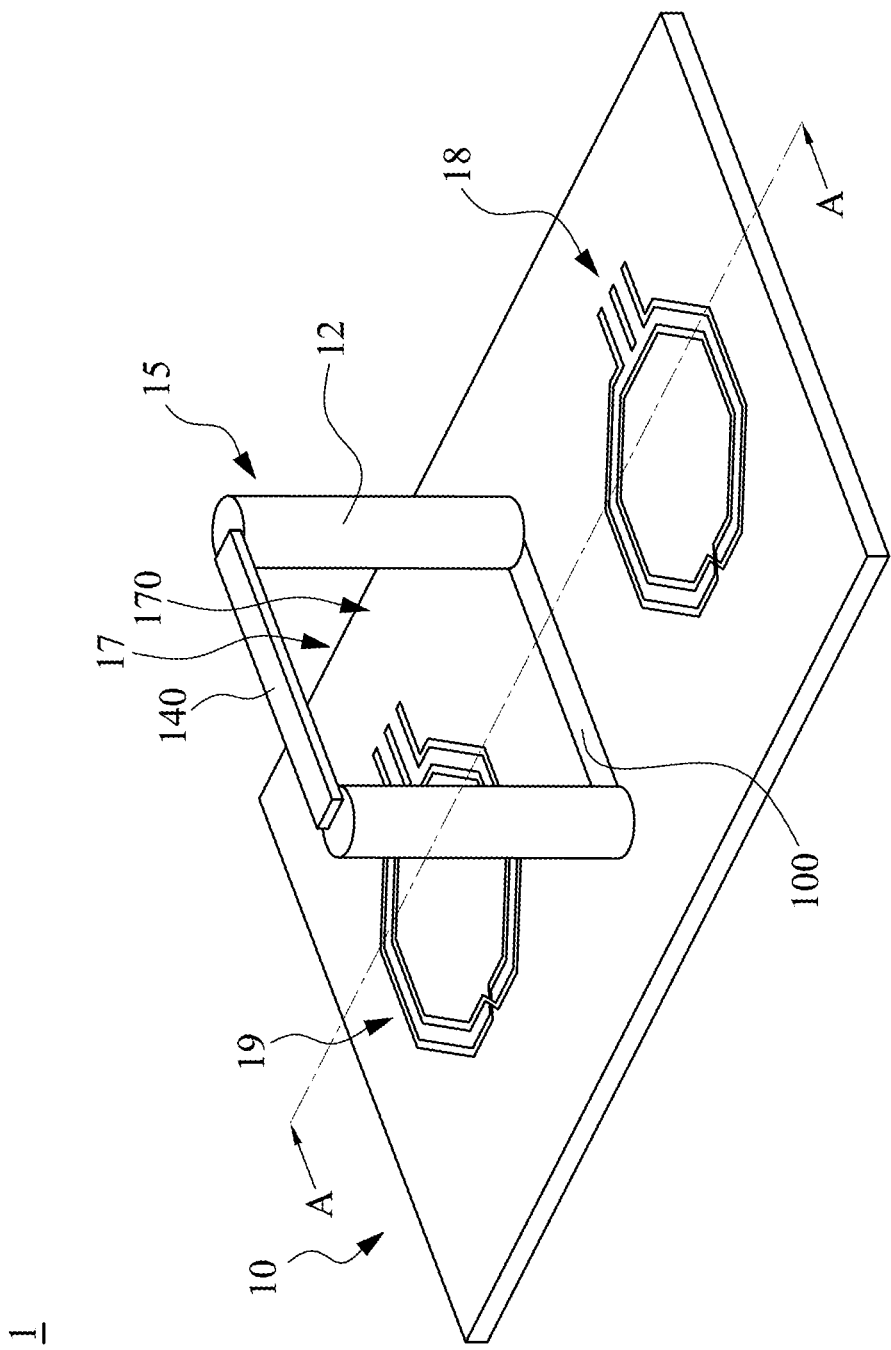
FIG. 1 is a perspective view of an electronic device in accordance with some embodiments of the present disclosure. It is understood that FIG. 1 has been simplified to omit an insulative material and a second semiconductor die for a better understanding of the embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to. Also, the term "couple" is intended to mean either an indirect or direct electrical connection. Accordingly, if one device is electrically connected to another device, that connection may be through a direct electrical connection, or through an indirect electrical connection via other devices and connections.

Figure 2:
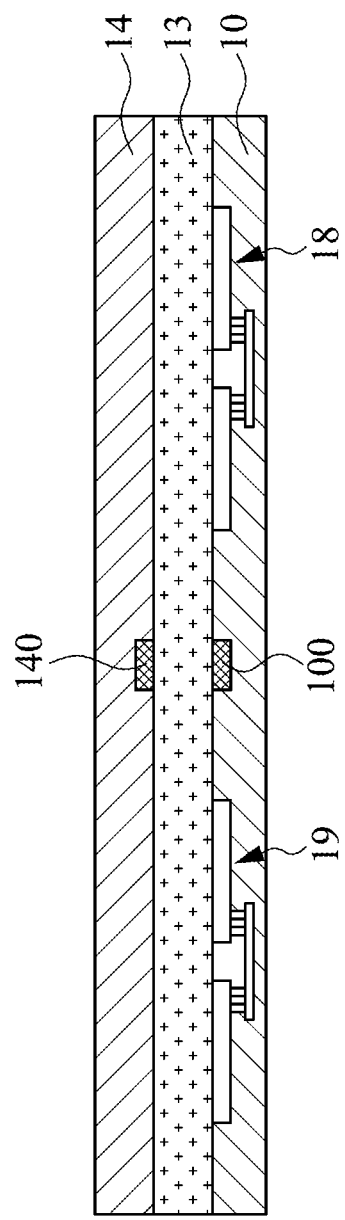
FIG. 2 is a cross-sectional view along section A-A in FIG. 1.

Reference is made to FIGS. 1 and 2. FIG. 1 is a perspective view of an electronic device 1 in accordance with some embodiments of the present disclosure. It is understood that FIG. 1 has been simplified to omit an insulative material 13 and a second semiconductor die 14 (see FIG. 2) for a better understanding of the embodiments of the present disclosure. FIG. 2 is a cross-sectional view along section A-A in FIG. 1. As shown in FIGS. 1 and 2, in some embodiments, the electronic device 1 includes a first semiconductor die 10, a plurality of bumps 12, the second semiconductor die 14 (which can be also referred to as a substrate, as shown in FIG. 2), the insulative material 13 (see FIG. 2), a first electromagnetic radiation source structure 18, and a second electromagnetic radiation source structure 19. The structure and function of the components and their relationships are described in detail hereinafter.

In some embodiments, the first semiconductor die 10 includes a first conductive feature 100. The second semiconductor die 14 includes a second conductive feature 140. In some other embodiments, the second semiconductor die 14 can be replaced by a printed circuit board (PCB). In some embodiments, the first conductive feature 100 of the first semiconductor die 10 and the second conductive feature 140 of the second semiconductor die 14 have a space 17 therebetween. That is, the first conductive feature 100 of the first semiconductor die 10 and the second conductive feature 140 of the second semiconductor die 14 are separated from each other by the space 17. Furthermore, the first semiconductor die 10 and the second semiconductor die 14 commonly form a three-dimensional integrated circuit (3D IC) stacking structure.

In FIG. 1, the bumps 12 are disposed on the first semiconductor die 10, and are connected to the first conductive feature 100 of the first semiconductor die 10. The bumps 12 are bonded with the second conductive feature 140 of the second semiconductor die 14 (see FIG. 2), whereby the bumps 12 are electrically connected to the second conductive feature 140. In other words, the bumps 12 are disposed in the space 17 to form at least one subspace 170 (only one is depicted). Specifically, the subspace 170 is formed and surrounded by adjacent two of the bumps 12, a portion of the first conductive feature 100 of the first semiconductor die 10, and a portion of the second conductive feature 140 of the second semiconductor die 14. Relatively, the adjacent two of the bumps 12, the portion of the first conductive feature 100 of the first semiconductor die 10, and the portion of the second conductive feature 140 of the second semiconductor die 14 surround and form a closed ring structure 15. In some embodiments, the bumps 12 are cylindrical bumps, and the present disclosure is not limited thereto. In some other embodiments, the bumps 12 can also be ball type. For example, the bumps 12 can be in a manner of a ball grid array (BGA).

In FIG. 2, the insulative material 13 is located between the first semiconductor die 10 and the second semiconductor die 14, and accommodates the bumps therein. That is, the first semiconductor die 10 and the second semiconductor die 14 are coupled with each other by the bumps 12, and the voids therebetween are filled with the insulative material 13. In some embodiments, the insulative material 13 is made of filler, and the present disclosure is not limited thereto.

Furthermore, at least one of the first conductive feature 100 of the first semiconductor die 10, the bumps 12, and the second conductive feature 140 of the second semiconductor die 14 is grounded or floated.

In FIG. 1, the first conductive feature 100 of the first semiconductor die 10 is located between the first electromagnetic radiation source structure 18 and the second electromagnetic radiation source structure 19. Furthermore, second conductive feature 140 of the second semiconductor die 14 (see FIG. 2) has a vertical projection on the first semiconductor die 10. The vertical projection of the second conductive feature 140 is located between the first electromagnetic radiation source structure 18 and the second electromagnetic radiation source structure 19. Specifically, the first electromagnetic radiation source structure 18 and the second electromagnetic radiation source structure 19 are separated at two sides of an entirety of the first conductive feature 100 of the first semiconductor die 10, the bumps 12, and the second conductive feature 140 of the second semiconductor die 14.

In some embodiments, the first electromagnetic radiation source structure 18 and the second electromagnetic radiation source structure 19 are inductance capacitance resonators (LC tank) respectively, and the present disclosure is not limited thereto. For example, the first electromagnetic radiation source structure 18 and the second electromagnetic radiation source structure 19 can be converters based on an inductance.

In some embodiments, the first electromagnetic radiation source structure 18 and the second electromagnetic radiation source structure 19 are disposed on the first semiconductor die 10, and the present disclosure is not limited thereto. In some other embodiments, an inductance portion and a capacitance portion of the LC tanks of the first electromagnetic radiation source structure 18 and the second electromagnetic radiation source structure 19 are disposed on different dies, and the dies are coupled with each other. For example, the different dies can be coupled with each other by a through silicon via (TSV) and/or a solder bump, and the present disclosure is not limited thereto.

According to Lenz's law, when the first electromagnetic radiation source structure 18 and the second electromagnetic radiation source structure 19 directly/indirectly emits electromagnetic radiation and the electromagnetic radiation passes through the subspace 170 of the ring structure 15, an inverse magnetic field within the subspace 170 will be induced on the ring structure 15 to actively suppress the electromagnetic radiation emitted from the first electromagnetic radiation source structure 18 and the second electromagnetic radiation source structure 19 passing through the subspace 170. In this way, the overall electromagnetic radiation passing through the subspace 170 is reduced. As such, the ring structure 15 can reduce the electromagnetic radiation emitted from the first electromagnetic radiation source structure 18 and the second electromagnetic radiation source structure 19, and suppress the coupling between the first electromagnetic radiation source structure 18 and the second electromagnetic radiation source structure 19.

For example, the ring structure 15 is located on a plane. The plane is substantially perpendicular to the first semiconductor die 10. As such configuration, when the electronic device 1 is operated, the coupling between the first electromagnetic radiation source structure 18 and the second electromagnetic radiation source structure 19 on the first semiconductor die 10 in a direction perpendicular to the plane described above is suppressed by the ring structure 15. Thus, the coupling phenomenon between the first electromagnetic radiation source structure 18 and the second electromagnetic radiation source structure 19 can be reduced, thereby reducing the effect of the coupling phenomenon on the performance of the electronic device 1, and thereby enhancing the operational efficiency of the electronic device 1.

Figure 3:
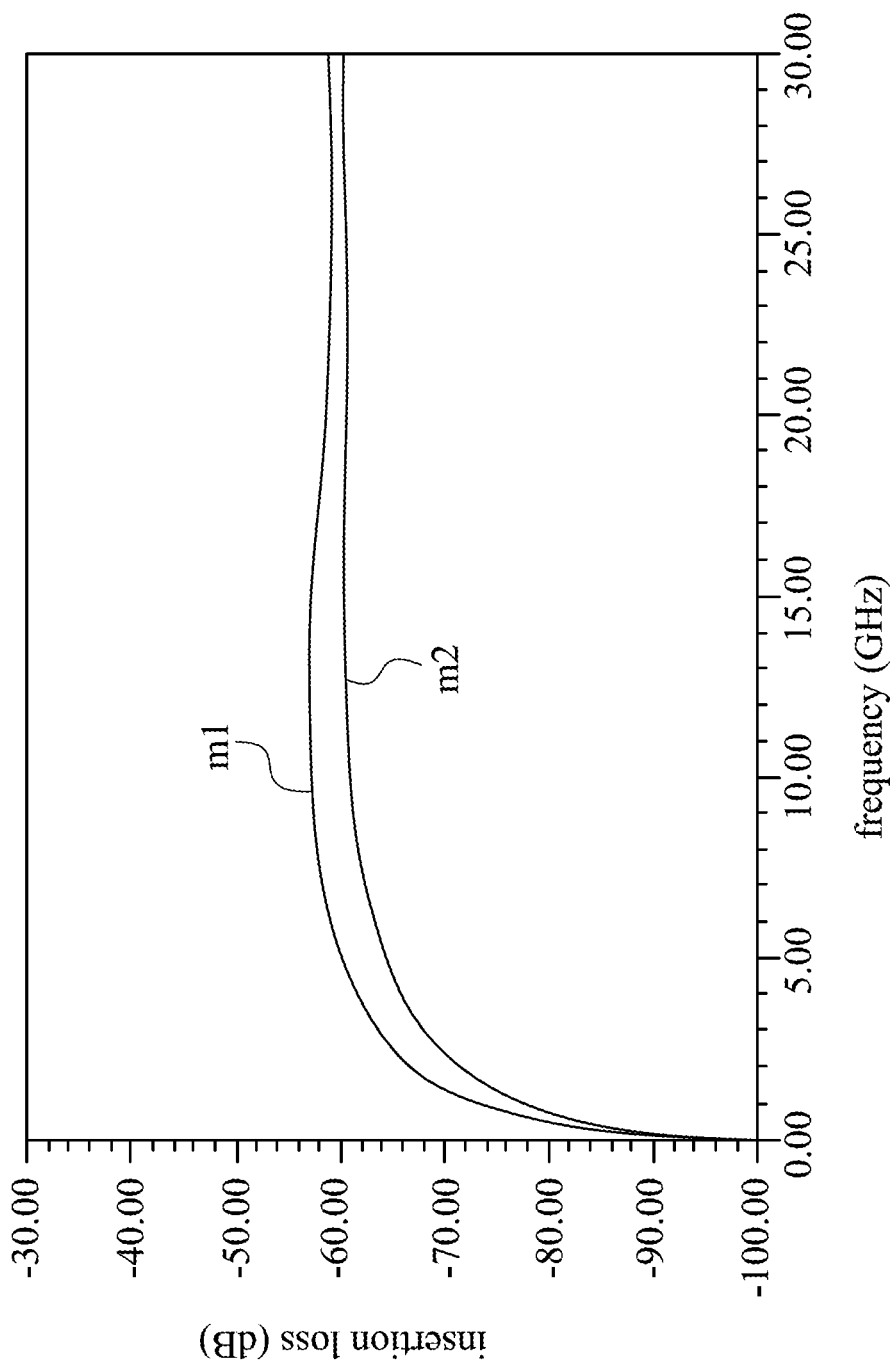
FIG. 3 is an experimental data diagram of an electronic device in according with some embodiments of the present disclosure.

Reference is made to FIG. 3. FIG. 3 is an experimental data diagram of an electronic device 1 in according with some embodiments of the present disclosure. This experimental data diagram is used for describing the insertion loss among the inductors in the integrated circuit when the integrated circuit operates in different frequencies. As shown in FIG. 3, the curve m1 represents experimental data if the ring structure 15 is not used in the electronic device 1. The curves m2 represents experimental data if the ring structure 15 is used in the electronic device 1 of embodiments of the present disclosure. As can be seen from FIG. 3, the coupling value of the curve m2 is lower than the coupling value of the curve m1. As a result, the experimental data shows that the electronic device 1 of embodiments of the present disclosure indeed can reduce coupling values among inductors, in which the reduced coupling value may be about 4 dB. Therefore, the problem of lowered performance of the electronic device 1 caused by inductor coupling can be resolved. However, the present disclosure is not limited to the foregoing embodiments, and a person skilled in the art may change parameters of the electronic device 1 for achieving the best performance.

Figure 4:
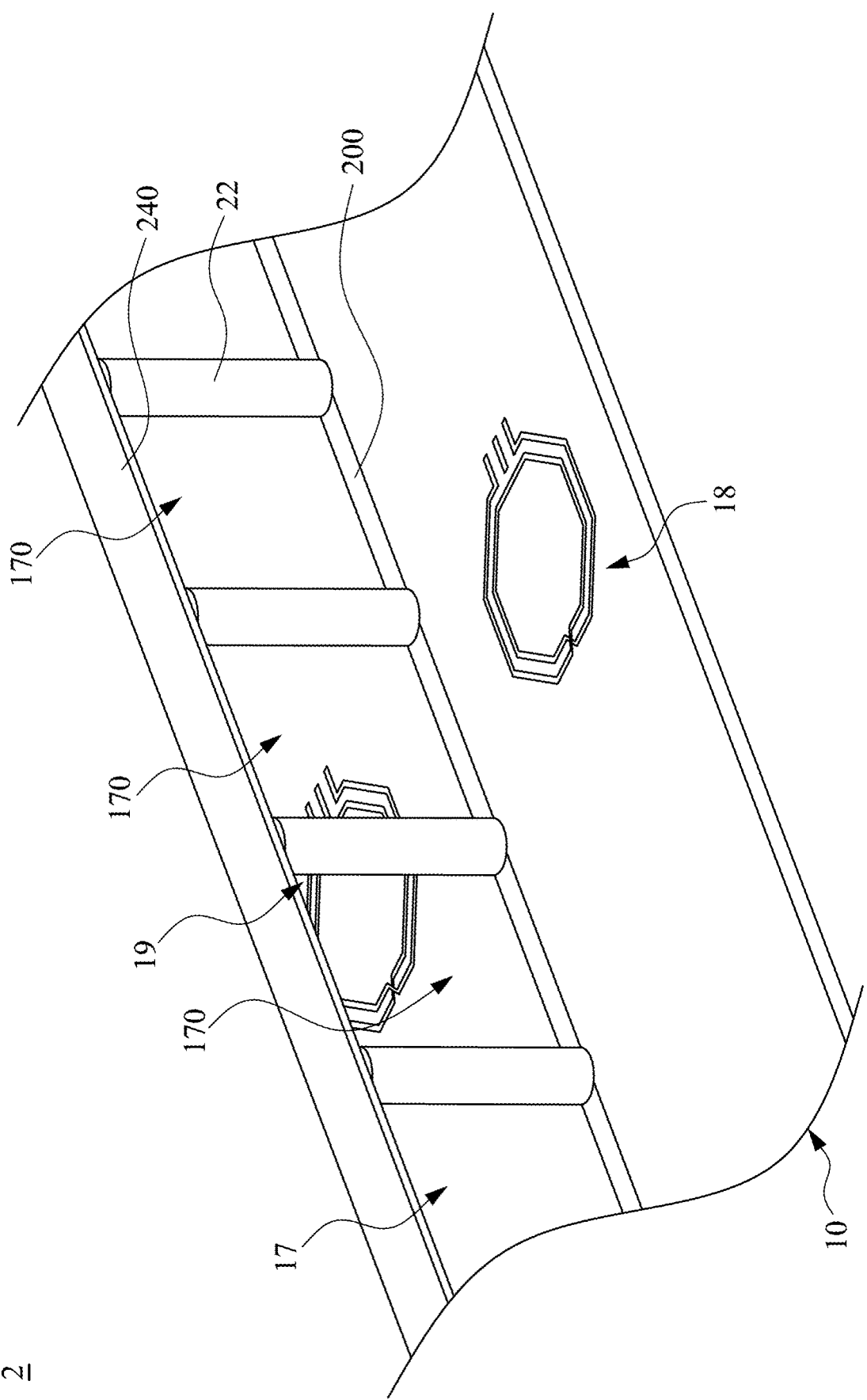
FIG. 4 is a perspective view of another electronic device in accordance with some embodiments of the present disclosure.

Reference is made to FIG. 4. FIG. 4 is a perspective view of an electronic device 2 in accordance with some embodiments of the present disclosure. It is understood that FIG. 4 has been simplified to omit the insulative material 13 and the second semiconductor die 14 for a better understanding of the embodiments of the present disclosure. As shown in FIG. 4, the electronic device 2 includes the first semiconductor die 10, a plurality of bumps 22, the first electromagnetic radiation source structure 18, and the second electromagnetic radiation source structure 19. In FIG. 4, the structure and function of the elements and the relationship therebetween are substantially the same as the electronic device 1 in FIGS. 1 and 2, and the related detailed descriptions may refer to the foregoing paragraphs, and are not discussed again herein. Hence, the present disclosure may repeat reference numerals and/or letters in the examples as the previous embodiment. This repetition is for the purpose of simplicity and clarity and represents the same or similar elements, and the description of the same technical contents is omitted. It is noted that, the difference between the present embodiment and that in FIGS. 1 and 2 are in that four of the bumps 22 are depicted, the first conductive feature 200 of the first semiconductor die 10 is connected to the bumps 22, and the second conductive feature 240 of the second semiconductor die 14 (not shown) is connected to the bumps 22. Therefore, the bumps 12, the first conductive feature 100, and the second conductive feature 140 shown in FIGS. 1 and 2 are respectively replaced with the bumps 22, the first conductive feature 200, and the second conductive feature 240 in this embodiment.

In some embodiments, the bumps are disposed in the space 17 to form a plurality of subspaces 170 (three are depicted). Each of the subspaces 170 is formed and surrounded by adjacent two of the bumps 22, a portion of the first conductive feature 200 of the first semiconductor die 10, and a portion of the second conductive feature 240 of the second semiconductor die 14, and the subspaces 17 are arranged in a series. As such, depending on the electromagnetic radiation range of the first electromagnetic radiation source structure 18 or the second electromagnetic radiation source structure 19, the subspaces 170 can be connected in series to suppress the coupling between the electromagnetic radiations of the first electromagnetic radiation source structure 18 and the second electromagnetic radiation source structure 19.

Figure 5:
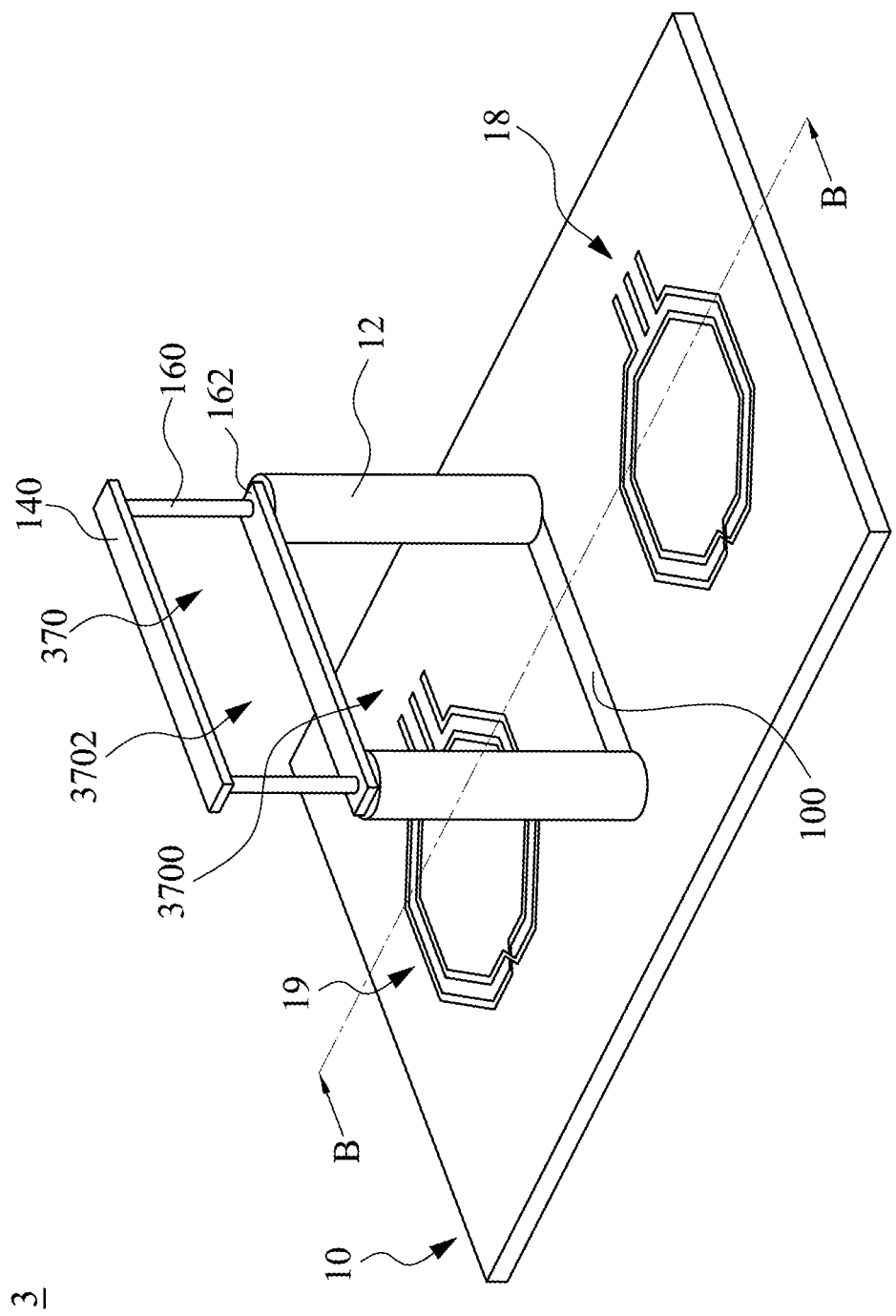
FIG. 5 is another perspective view of an electronic device in accordance with some embodiments of the present disclosure. It is understood that FIG. 5 has been simplified to omit an insulative material, a second semiconductor die, and a third semiconductor die for a better understanding of the embodiments of the present disclosure.
Figure 6:
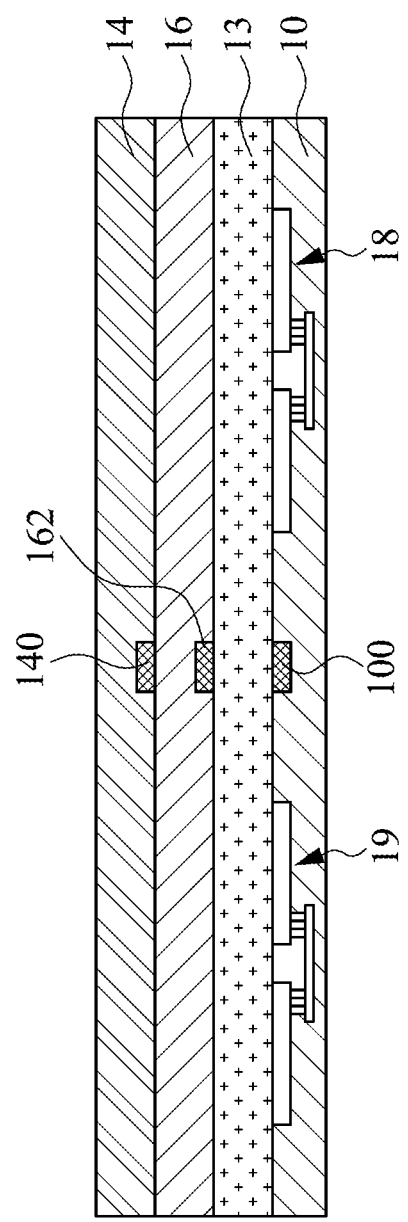
FIG. 6 is a cross-sectional view along section B-B in FIG. 5.

Reference is made to FIGS. 5 and 6. FIG. 5 is a perspective view of an electronic device 3 in accordance with some embodiments of the present disclosure. It is understood that FIG. 5 has been simplified to omit the insulative material 13, the second semiconductor die 14, and a third second semiconductor die 16 (see FIG. 6) for a better understanding of the embodiments of the present disclosure. FIG. 6 is a cross-sectional view along section B-B in FIG. 5. As shown in FIGS. 5 and 6, the electronic device 3 includes the first semiconductor die 10, the bumps 12, the insulative material 13 (see FIG. 6), the third second semiconductor die 16 (see FIG. 6), the second semiconductor die 14 (see FIG. 6), the first electromagnetic radiation source structure 18, and the second electromagnetic radiation source structure 19. In FIGS. 5 and 6, the structure and function of the elements and the relationship therebetween are substantially the same as the electronic device 1 in FIGS. 1 and 2, and the related detailed descriptions may refer to the foregoing paragraphs, and are not discussed again herein. Hence, the present disclosure may repeat reference numerals and/or letters in the examples as the previous embodiment. This repetition is for the purpose of simplicity and clarity and represents the same or similar elements, and the description of the same technical contents is omitted. It is noted that, the difference between the present embodiment and that in FIGS. 1 and 2 are in that the electronic device 3 further includes the third second semiconductor die 16.

In some embodiments, the third second semiconductor die 16 of the electronic device 3 is located between the first semiconductor die 10 and the second semiconductor die 14 to form a 3D IC stacking structure, and includes a plurality of conductive contacts 160 and a third conductive feature 162. The third conductive feature 162 of the third second semiconductor die 16 is connected to the conductive contacts 160. In some other embodiments, the third conductive feature 162 may not be disposed on the electronic device 3. In some embodiments, the conductive contacts 160 can be a plurality of through silicon vias respectively, and the present disclosure is not limited to the number of semiconductor dies or the stacking manner of semiconductor dies. For example, the stacking manner of the present disclosure can be also a 2.5D IC stacking structure. Furthermore, different dies may be implemented by the same or different semiconductor manufacturing process.

In FIGS. 5 and 6, the bumps 12 are disposed on the first semiconductor die 10, connected to the first conductive feature 100 of the first semiconductor die 10, and respectively bonded with the conductive contacts 160 of the third second semiconductor die 16. That is, the first semiconductor die 10 and the third semiconductor die 16 are coupled with each other by the bumps 12, and the voids therebetween are filled with the insulative material 13. Furthermore, the conductive contacts 160 of the third second semiconductor die 16 are electrically connected to the second conductive feature 140 of the second semiconductor die 14. Therefore, the bumps 12 are electrically connected to the second conductive feature 140 of the second semiconductor die 14 through the conductive contacts 160 of the third second semiconductor die 16 respectively.

In the aforementioned configurations, at least one subspace 370 (only one is depicted) is formed and surrounded by a portion of the first conductive feature 100 of the first semiconductor die 10, adjacent two of the bumps 12, adjacent two of the conductive contacts 160 of the third second semiconductor die 16, and a portion of the second conductive feature 140 of the second semiconductor die 14. In some embodiments, the third conductive feature 162 of the third second semiconductor die 16 and the portion of the first conductive feature 100 of the first semiconductor die 10, and the adjacent two of the bumps 12 are surrounded and formed a subspace 3700. On the other hand, the third conductive feature 162 of the third second semiconductor die 16, the portion of the first conductive feature 100 of the first semiconductor die 10, and the adjacent two of the conductive contacts 160 are surrounded and formed a subspace 3702. As such, depending on the electromagnetic radiation range of the first electromagnetic radiation source structure 18 or the second electromagnetic radiation source structure 19, the subspaces 370, 3700, and 3702 can be designed to suppress the coupling between the electromagnetic radiations of the first electromagnetic radiation source structure 18 and the second electromagnetic radiation source structure 19.

Figure 7:
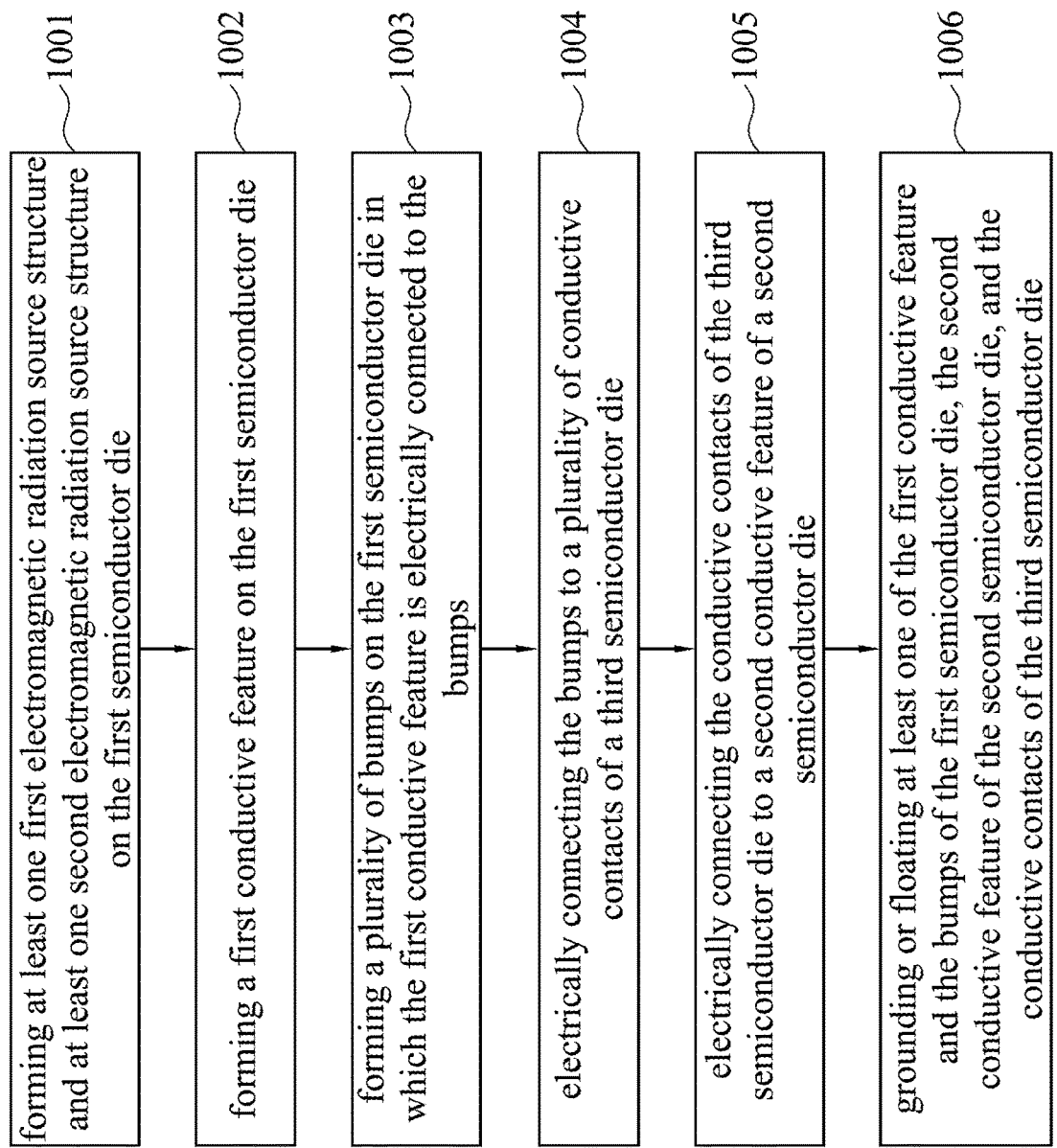
FIG. 7 is a flow chart of a method for manufacturing an electronic device in accordance with some embodiments of the present disclosure.

Reference is made to FIG. 7. FIG. 7 is a flow chart of a method for manufacturing the electronic device 3 in accordance with some embodiments of the present disclosure. It is understood that FIG. 3 has been simplified for a better understanding of the embodiments of the present disclosure. Accordingly, additional processes may be provided before, during, and after the stages of fabrication of FIG. 3, and some other processes may be briefly described herein. Specifically, the method for manufacturing the electronic device 3 includes steps S1001-S1006.

In S1001, forming at least one first electromagnetic radiation source structure 18 on the first semiconductor die 10, and forming at least one second electromagnetic radiation source structure 19 on the first semiconductor die 10.

In S1002, forming the first conductive feature 100 on the first semiconductor die 10.

In S1003, forming the bumps 12 on the first semiconductor die 10, in which the first conductive feature 100 is electrically connected to the bumps 12. In some embodiments, the first electromagnetic radiation source structure 18 is located at a side of an entirety of the first conductive feature 100 of the first semiconductor die 10, the bumps 12, and a second conductive feature 140 of a second semiconductor die 14 subsequently formed. The second electromagnetic radiation source structure 19 is located at another side of an entirety of the first conductive feature 100 of the first semiconductor die 10, the bumps 12, and the second conductive feature 140 subsequently formed (as shown in FIG. 5).

In S1004, electrically connecting the bumps 12 to the conductive contacts 160 of the third semiconductor die 16 respectively. In some other embodiments, in the case where the third semiconductor die 16 is not provided, the second conductive feature 140 of the second semiconductor die 14 can be directly bonded to the bumps 12 to electrically connect the bumps 12 to the second conductive features 140.

In S1005, electrically connecting the conductive contacts 160 of the third semiconductor die 16 to the second conductive feature 140 of the second semiconductor die 14

In S1006, grounding or floating at least one of the at least one of the first conductive feature 100 of the first semiconductor die 10, the bumps 12, the second conductive feature 140 of the second semiconductor die 14, and the conductive contacts 160 of the third second semiconductor die 16.

In particular, it is envisaged that the aforementioned inventive concept can be applied by a semiconductor manufacturer to any integrated circuit. It is further envisaged that a semiconductor manufacturer may employ the inventive concept in the design of a standalone device, or application specific integrated circuit (ASIC) and/or any other subsystem element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term "comprising" does not exclude the presence of other elements or steps.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second", etc. do not preclude a plurality.

Thus, improved electromagnetic radiation suppression structures and associated methods have been described, wherein the aforementioned disadvantages with prior art arrangements have been substantially alleviated.

It is noted that, although the terms "first", "second", "third" and so on are used in the text to describe various elements, these described elements should not be limited by such terms. Such terms are used to distinguish one element from another element. Thus, the element discussed above, such as, a "first element" can be written as "second element" which is without departing from the teachings of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
   a first semiconductor die comprising:
      a first electromagnetic radiation source structure;
      a second electromagnetic radiation source structure; and
      a first conductive feature that is between the first and second electromagnetic radiation source structures and is substantially a straight line having a linewidth greater than linewidths of the first and second electromagnetic radiation source structures;
   a plurality of bumps disposed on the first semiconductor die and connected to the first conductive feature; and
   a substrate comprising a second conductive feature, wherein the bumps are electrically connected to the second conductive feature and are directly in contact with the first and second conductive features, and the first conductive feature, the bumps, and the second conductive feature are configured to form at least one ring structure.

2. The electronic device of claim 1, wherein the bumps are bonded with the second conductive feature.

3. The electronic device of claim 1, wherein the substrate is a printed circuit board.

4. The electronic device of claim 1, wherein the substrate is a second semiconductor die.

5. The electronic device of claim 1, further comprising a third semiconductor die, wherein the third semiconductor die is located between the first semiconductor die and the substrate, and the bumps are electrically connected to the second conductive feature through the third semiconductor die.

6. The electronic device of claim 5, wherein the third semiconductor die comprises a plurality of conductive contacts, and the bumps are electrically connected to the second conductive feature respectively through the conductive contacts.

7. The electronic device of claim 6, wherein the third semiconductor die comprises a third conductive feature, and the third conductive feature is connected to the conductive contacts.

8. The electronic device of claim 1, wherein the first conductive feature and the second conductive feature have a space therebetween, the bumps are disposed in the space to form at least one subspace, and the subspace is surrounded and formed by adjacent two of the bumps, a portion of the first conductive feature, and a portion of the second conductive feature.

9. The electronic device of claim 8, wherein a number of the at least one subspace is plural, and the subspaces are arranged in a series.

10. The electronic device of claim 1, wherein at least one of the first conductive feature, the bumps, and the substrate is grounded.

11. The electronic device of claim 1, wherein at least one of the first conductive feature, the bumps, and the substrate is floated.

12. The electronic device of claim 1, wherein the second conductive feature has a vertical projection on the first semiconductor die, and the vertical projection is located between the first electromagnetic radiation source structure and the second electromagnetic radiation source structure.

13. The electronic device of claim 1, wherein the first electromagnetic radiation source structure and the second electromagnetic radiation source structure are separated at two sides of an entirety of the first conductive feature, the bumps, and the second conductive feature.

\* \* \* \* \*